United States Patent [19]

Hutchings et al.

[11] Patent Number: 5,387,528
[45] Date of Patent: Feb. 7, 1995

[54] METHOD OF MANUFACTURING A SEMICONDUCTOR DEVICE COMPRISING AN INSULATED GATE FIELD EFFECT DEVICE

[75] Inventors: Keith M. Hutchings, Groombridge; Andrew L. Goodyear, Redhill; Andrew M. Warwick, Stockport, all of England

[73] Assignee: U.S. Philips Corporation, New York, N.Y.

[21] Appl. No.: 95,972

[22] Filed: Jul. 22, 1993

[30] Foreign Application Priority Data

Jul. 23, 1992 [GB] United Kingdom ............... 9215653

[51] Int. Cl.⁶ .......................................... H01L 21/265
[52] U.S. Cl. ..................... 437/40; 437/203; 437/913; 148/DIG. 126
[58] Field of Search ............. 437/40, 913, 203, 78, 437/47, 38, 67; 148/DIG. 126

[56] References Cited

U.S. PATENT DOCUMENTS

| | | |
|---|---|---|
| 4,573,066 | 2/1986 | Whight . |
| 4,707,719 | 11/1987 | Whight . |
| 4,774,560 | 9/1988 | Coe . |
| 4,830,981 | 5/1989 | Baglee et al. ............ 437/47 |
| 4,904,613 | 2/1990 | Coe et al. ............... 437/29 |
| 4,914,058 | 4/1990 | Blanchard ........... 148/DIG. 126 |
| 4,920,064 | 4/1990 | Whight ............... 148/DIG. 126 |
| 4,983,535 | 1/1991 | Blanchard ............ 437/40 |
| 5,072,266 | 12/1991 | Bulucea et al. . |
| 5,160,491 | 11/1992 | Mori .................. 437/40 |
| 5,242,845 | 9/1993 | Baba et al. ........... 437/40 |

FOREIGN PATENT DOCUMENTS

| | | |
|---|---|---|
| 0150365 | 10/1988 | European Pat. Off. . |
| 0111181 | 6/1990 | European Pat. Off. . |
| 57-83064 | 5/1982 | Japan ................ 437/913 |
| 0290567 | 3/1990 | Japan ................ 437/911 |

OTHER PUBLICATIONS

Siemens Forschungs und Entwicklungsberichte BD 9 (1980) at pp. 190–194; "SIPMOS Technology, an Example of VLSI Precision Realized with Standard LSI for Power Transistor".

Primary Examiner—Brian E. Hearn
Assistant Examiner—Michael Trinh
Attorney, Agent, or Firm—Steven R. Biren

[57] ABSTRACT

A semiconductor body (3) has a first region (4) of one conductivity type adjacent one major surface (5). A first masking layer (6) comprising at least one first mask window (6a) spaced from a second mask window (6b) is defined on the surface (5). Opposite conductivity type impurities are then introduced through the first masking layer (6) and a second masking layer (8) which is selectively removable with respect to the first masking layer (6) is subsequently provided on the first masking layer and patterned to leave a mask area (8a) covering the first mask window (6a). The semiconductor body (3) is then etched through the second mask window (6b) to define a recess (9) extending into the first region (4) while leaving the introduced impurities beneath the masked first mask window (6a) to form a relatively highly doped second region (7). The first and second masking layers (6 and 8) are removed and an insulated gate structure (10) is provided by defining a gate insulating layer (10a) on the recess walls (9a) and providing a gate conductive region (10b) on the insulating layer (10a). A relatively lowly doped third region (11) of the opposite conductivity type is provided to extend between the relatively highly doped second region (7) and the recess (9) to provide a conduction channel area (11a) adjacent the insulated gate structure (10). A fourth region (12) is provided to form a potential barrier (12a) with the relatively lowly doped third region (11) so that the conduction channel area (11a) provides a conductive path between the fourth and first regions (12 and 4).

12 Claims, 4 Drawing Sheets

METHOD OF MANUFACTURING A SEMICONDUCTOR DEVICE COMPRISING AN INSULATED GATE FIELD EFFECT DEVICE

BACKGROUND OF THE INVENTION

This invention relates to a method of manufacturing a semiconductor device comprising an insulated gate field effect device.

U.S. Pat. No. 5,072,266 describes a method for manufacturing a semiconductor device comprising a power MOSFET. As described, a semiconductor body is provided having adjacent one major surface a first region of one conductivity type which will form the drain drift region of the MOSFET. A first masking layer is defined on the one major surface so as to have a plurality of mask windows through which impurities are introduced to form relatively highly doped second regions of the opposite conductivity type. After removal of the first masking layer, a second masking layer is defined having mask windows through which impurities are introduced to provide third regions of the same conductivity type but more lowly doped than the second regions such that each third region is surrounded by an adjoining second region, and to form a fourth region of the one conductivity type within each third region.

After removal of the second masking layer, a third masking layer is provided which has a respective mask window over the central area of each fourth region. The exposed semiconductor surface is then etched to define a recess extending through each fourth and third region into the first region. The recesses are formed so as to provide a continuous grid-like trench. An insulated gate structure is then defined by providing a gate insulating layer on the walls of the recesses and then providing a gate conductive region to fill the recesses. Areas of the third regions adjacent the insulated gate structure define conduction channel areas through which conduction between the fourth and first regions is controllable by the insulated gate structure.

As described in U.S. Pat. No. 5,072,266 the second regions are formed, in a manner analogous to that used in planar DMOS (double-diffused MOS) technology, so as to be deeper than the second regions and, in particular, so as to extend into the semiconductor body beyond the trench so as to move the point at which the device would avalanche during operation away from the trench corners and into the bulk of the semiconductor body. This should avoid or at least reduce the possibility of avalanche breakdown at the trench corners which could otherwise result in performance degradation due to injection of hot charge carriers into the gate insulating layer or even device destruction due to bipolar breakdown.

As will be evident from the description given above, in order to produce devices which have reproducible characteristics from batch to batch, the method disclosed in U.S. Pat. No. 5,072,266 requires very precise alignment of the three separate masking layers used to form the second region, the third and fourth regions and the trench for the insulated gate structure. Furthermore, in practice it is of course necessary to allow a certain degree of tolerance in the device dimensions to compensate for any misalignment of the various masking layers especially so as to avoid any encroachment of the impurities forming the second regions into the conduction channel areas as this would of course affect the threshold voltage of the device. The necessity of allowing for such tolerances places a limit on the minimum lateral dimensions which can be used.

SUMMARY OF THE INVENTION

According to the present invention, there is provided a method of manufacturing a semiconductor device comprising an insulated gate field effect device, which method comprises providing a semiconductor body having a first region of one conductivity type adjacent one major surface, defining on the one major surface a first masking layer comprising at least one first mask window spaced from a second mask window, introducing into the semiconductor body through the first masking layer impurities for forming regions of the opposite conductivity type to the first region, providing on the first masking layer a second masking layer which is selectively removable with respect to the first masking layer, patterning the second masking layer to leave a mask area covering the first mask window, etching the semiconductor body through the second mask window to define a recess extending into the first region beneath the second mask window while leaving the introduced impurities in the semiconductor body beneath the masked first mask window to form a relatively highly doped second region of the opposite conductivity type, removing the first and second masking layers, providing an insulated gate structure by defining a gate insulating layer on the recess surface and providing a gate conductive region on the insulating layer, providing a relatively lowly doped third region of the opposite conductivity type extending between the relatively highly doped second region and the insulated gate structure to provide a conduction channel area adjacent the insulated gate structure, and providing a fourth region forming a potential barrier with the relatively lowly doped third region so that the conduction channel area provides a conductive path controllable by the insulated gate structure between the fourth and first regions.

Thus, in a method in accordance with the invention, the recess is automatically aligned with the second region because the respective locations are determined by the relative locations of the first and second mask windows in the first masking layer and not by separate masking layers which require alignment. The alignment of the second masking layer in a method in accordance with the invention is, by contrast to the situation in respect of the method described in U.S. Pat. No. 5,072,266, not critical. It is merely necessary to cover the first mask window and to ensure that the masking areas of the second masking layer do not encroach onto the second mask window where the recess is to be formed. The fact that the second region and recess are thus automatically aligned means that the device characteristics should be more reproducible between different processing batches. Moreover, the amount of tolerance required to ensure that the relatively highly doped second region does not encroach into the conduction channel area is reduced which should enable a reduction in lateral dimensions.

The insulated gate field effect device may consist of a number of parallel-connected insulated gate field effect device cells as, for example, in the case where the device is a power semiconductor device. In such a case, a method in accordance with the invention may comprise defining the first masking layer to have a plurality of first mask windows with adjacent first mask windows separated by and spaced from the second mask window, introducing the impurities through the first masking layer for forming a respective second region beneath each first mask window and providing a respective third region and a respective fourth region for each second region.

The first masking layer may be provided so that the second mask window defines a grid-like aperture bounded by islands of the first masking layer within which the first mask windows are formed. The recesses and thus the insulated gate structure will then define a similar grid-like pattern.

An inverse arrangement in which the first masking layer is provided so that there is a plurality of first mask windows spaced apart by a second mask window which defines a grid-like aperture could also be envisaged. In such a case, there would be a continuous grid-like second region with separated recesses containing insulated gates which would need to be connected by subsequent metallisation.

An intermediate mask may be provided over the second mask window during the introduction of the impurities for forming the or each second region. Masking the second mask window in which the recess is to be formed protects the second mask window from the impurities introduced through the first mask window and thus removes the possibility of sideways scattering of impurities implanted through the second window and therefore avoids any need to be careful to ensure that the etching of the recess removes any such sideways scattered impurities which might otherwise have a slight affect on the device threshold voltage. As a possible alternative, the size of the second mask window area could be increased slightly after implanting the opposite conductivity type impurities so as to ensure that the subsequent etching of the recess removes sideways scattered impurities.

The opposite conductivity type impurities introduced through the first masking layer may be caused to diffuse into the first region sufficiently far that the or each relatively highly doped second region extend into the semiconductor body for a distance from the one major surface greater than the recess depth. This should ensure that the point at which the device would avalanche in operation is moved away from the insulated gate structure into the bulk of the semiconductor body. This should reduce the possibility of hot charge carrier injection into the gate insulating layer which could otherwise result in performance degradation. Moving the point of initiation of avalanching into the bulk of the semiconductor device should be of advantage where the device is to be used for switching an inductive load because higher currents can be carried within the bulk of the semiconductor body thus enabling faster dissipation of the excessive energy resulting from rapid rise in voltage across the device which may occur during the switching of an inductive load than is possible where avalanching is initiated adjacent a recessed insulated gate structure. This should reduce the possibility of irreversible breakdown of the device. The fact that the or each second region is automatically aligned to the insulated gate structure means that, in the case of a device consisting of a number of device cells, the or each second region can be centrally located with respect to insulated gate structure so that no part of the device is any more weak (i.e. more susceptible to parasitic bipolar action) than any other part of the device, as might otherwise occur due to misalignment tolerances in the absence of such automatic alignment.

The or each fourth region may be defined as a semiconductor region of the one conductivity type with each fourth region forming with the associated relatively highly doped second region a pn junction meeting the one major surface. As possible alternatives, the or each fourth region may comprise a conductive region forming a Schottky contact to the third region or doped semiconductor layer provided on the one major surface.

The first and second masking layers may be removed before defining the gate insulating layer.

The first and second masking layers may be provided as layers of photosensitive resist and the first masking layer made resistant to the patterning of the second masking layer by heating the first masking layer and subsequently implanting the opposite conductivity type impurities for forming the or each second region into the semiconductor body through the first masking layer.

In this example both the first and second masking layers can be formed of photosensitive resist material because the first masking layer is hardened and thus made resistant to the patterning of the second masking layer. The use of photosensitive resists is advantageous because they are relatively cheap to purchase and can be applied and defined relatively quickly and easily.

As one possible alternative, a method in accordance with the invention may comprise defining the first masking layer by providing an insulating layer on the one major surface, defining a photosensitive resist masking layer having resist mask windows and etching the insulating layer through the resist mask windows to define the first and second mask windows within the insulating layer. The use of an insulating layer to form the first masking layer has advantages in that it should be less susceptible to erosion during the etching of the recess than a photosensitive resist mask. Moreover, the use of an insulating layer as the first masking layer should facilitate the use of an intermediate mask area, as mentioned above, to protect the second mask window during the introduction of the impurities for forming the second regions by allowing, for example, the intermediate mask area to be defined from a photosensitive resist layer which can be removed selectively with respect to the insulating layer. In such a case, the second masking layer may be provided as a layer of photosensitive resist which is relatively cheap and can be applied and defined relatively quickly and easily.

The gate conductive layer may fill the recess as in the so-called Trenchfet type of device so as to provide a relatively flat surface enabling good coverage by subsequent layers.

The or each relatively lowly doped third region may be provided by forming a continuous layer of the opposite conductivity type adjacent the one major surface prior to defining the first masking layer. This avoids the need for any masking layer for defining the or each third region which is thus defined by the adjoining second region and recess.

BRIEF DESCRIPTION OF THE DRAWINGS

Embodiments of the invention will now be described by way of example with reference to the accompanying drawings, in which.

It should of course be understood that the Figures are not to scale and that certain dimensions, such as the thicknesses of layers or regions, may have been exaggerated in the interests of clarity. Like reference numerals are used throughout the drawings to refer to like parts.

DESCRIPTION OF THE PREFERRED EMBODIMENT

Figure 1:
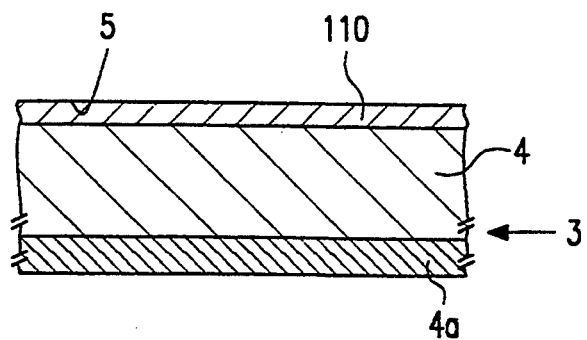
FIG. 1 is a cross-sectional view of part of semiconductor body.

Referring now to the drawings, there is illustrated a method of manufacturing a semiconductor device 1 comprising an insulated gate field effect device 2, which method comprises providing a semiconductor body 3 having a first region 4 of one conductivity type adjacent one major surface 5, defining on the one major surface 5 a first masking layer 6 comprising at least one first mask window 6a spaced from a second mask window 6b, introducing into the semiconductor body 3 through the first masking layer 6 impurities for forming regions 7a and 7b of the opposite conductivity type to the first region 4, providing on the first masking layer 6 a second masking layer 8 which is selectively removable with respect to the first masking layer 6, patterning the second masking layer 8 to leave a mask area 8a covering the first mask window 6a, etching the semiconductor body 3 through the second mask window 6b to define a recess 9 extending into the first region 4 beneath the second mask window 6b while leaving the introduced impurities in the semiconductor body beneath the masked first mask window 6a to form a relatively highly doped second region 7 of the opposite conductivity type, removing the first and second masking layers 6 and 8, providing an insulated gate structure 10 by defining a gate insulating layer 10a on the recess surface or walls 9a and providing a gate conductive region 10b on the insulating layer 10a, providing a relatively lowly doped third region 11 of the opposite conductivity type extending between the relatively highly doped second region 7 and the recess 9 to provide a conduction channel area 11a adjacent the insulated gate structure 10, and providing a fourth region 12 forming a potential barrier 12a with the relatively lowly doped third region 11 so that the conduction channel area 11a provides a conductive path controllable by the insulated gate structure between the fourth and first regions 12 and 4.

In such a method, the recess 9 is automatically aligned with the second regions 7 because their respective locations are determined by the relative locations of the first and second mask windows 6a and 6b which are defined in a single masking layer 6. Moreover the alignment of the second masking layer 8 is not critical because it is merely necessary to ensure that the first mask windows 6a are covered while the at least one second mask window 6b is exposed to enable definition of the recess 9. This should enable a reduction in alignment tolerances. Where the insulated gate field effect device consists of a number of device cells as in the examples to be described below with reference to the drawings, this allows an increase in packing density which may provide for a lower on-resistance or a smaller chip size.

Referring now specifically to the drawings. FIG. 1 illustrates part of a semiconductor body 3 which comprises a, in this example, highly doped monocrystalline silicon substrate 4a of the one conductivity type, n conductivity type in this example, on which is provided a relatively lowly doped n conductivity type silicon epitaxial layer to form the first region 4. In this example, a layer 110 of relatively lowly doped p conductivity type monocrystalline silicon is provided at the one major surface 5 of the semiconductor body 3. This layer 110 may be an epitaxial layer or may be formed by the blanket or uniform introduction of impurities into the one major surface 5. As will become evident shortly, the layer 110 is used to form the relatively lowly doped conduction channel area-defining third regions 11.

Figure 2:
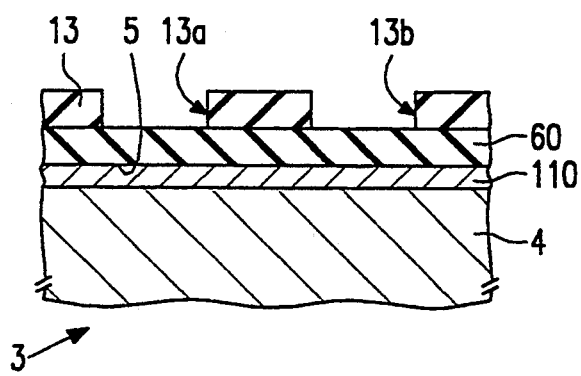
FIGS. 2 to 4 are cross-sectional views of a portion of a semiconductor body for illustrating steps in a method in accordance with the invention.

The first masking layer 6 is defined on the one major surface 5 over the p conductivity type layer 110. In the example illustrated in FIG. 2, the first masking layer 6 is defined by first depositing on the one major surface 5 an insulating layer 60. The insulating layer 60 is generally deposited or sputtered and may be, for example, a silicon oxide layer deposited by conventional chemical vapour deposition techniques. Other suitable insulating layers which can be selectively etched with respect to monocrystalline silicon such as $Si_3N_4$, TEOS, LOPOX could also be used. An auxiliary masking layer 13, in this example a layer of a suitable conventional photo-sensitive resist, is then provided on the insulating layer 60 and patterned using conventional photolithographic and etching techniques to define an auxiliary mask pattern having auxiliary first and second mask windows 13a and 13b (only one of each being shown) which register with the desired locations of the first and second mask windows in the first masking layer. The insulating layer 60 is then etched using an appropriate conventional etching process, typically an anisotropic etching process such as a reactive ion etching (RIE) or plasma process to define the first masking layer 6 having the first and second mask windows 6a and 6b. The auxiliary masking layer 13 is then removed using known techniques to produce the structure shown in FIG. 3.

Figure 3:
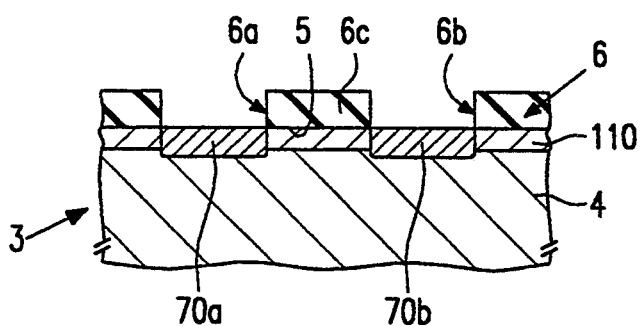

The impurities for forming the second region 7 are now introduced through the first and second mask windows 6a and 6b. In this example, the impurities are of p conductivity type and generally are introduced by implanting boron ions with an energy in the range of, typically, from 45 keV to 100 keV, for example 70 keV, (kiloelectron volts) and a dose of typically $1 \times 10^{15}$ ions $cm^{-2}$. FIG. 3 shows the p conductivity regions 70a and 70b implanted within the first and second mask windows 6a and 6b, respectively.

Figure 4:
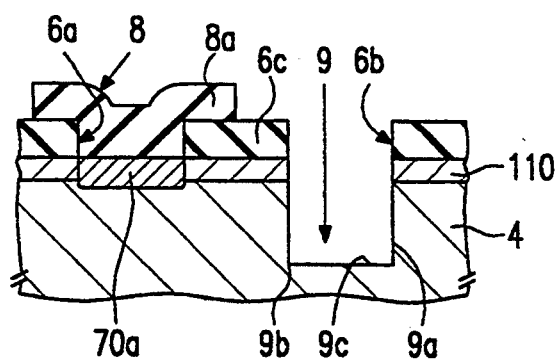

The second masking layer 8 is then provided over the structure on the one surface 5. The second masking layer 8 is formed of a material which can be removed selectively with respect to the first masking layer 6 and, of course, the semiconductor body 3. In this example, the second masking layer 8 may be formed of any suitable known photosensitive resist material. The second masking layer 8 is defined using conventional photolithographic and etching processes to leave mask areas 8a covering only the first mask windows 6a (only one of which is shown) as shown in FIG. 4. Thus, the or each first mask window 6a at which a second region 7 is to be formed is protected by a respective mask area 8a while the second mask window 6b is exposed. The alignment of the mask area 8a of the second masking layer 8 to the mask windows 6a and 6b of the first masking layer 6 is not particularly critical. All that is required is that the or each first mask window 6a be covered and the second mask window 6b be exposed. The degree of overlap of a second mask area 8a onto the first masking layer 6 is thus not of importance.

The recess 9 is now formed, as shown in FIG. 4, by etching the semiconductor material exposed at the first mask window 6b. Typically, this etching process involves an anisotropic etch generally an RIE (Reactive Ion Etch) or plasma process, possibly followed by a short isotropic etch to round off or smooth the corners 9b of the recess 9. The etching of the recess 9 removes the impurities implanted to form the region 70b beneath the second mask window 6b. The etching process used to define the recess 9 is preferably designed, using known techniques, to etch slightly sideways underneath the second mask window so as to remove any sideways scattered impurities arising from the implantation of the regions 70a and 70b.

Figure 5:
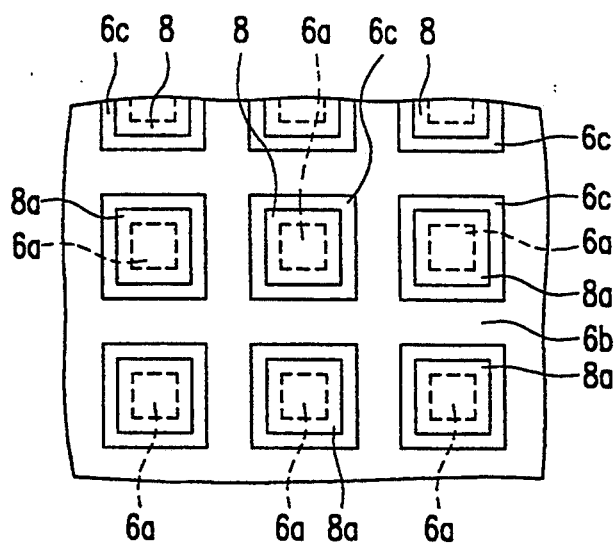
FIG. 5 is a top plan view of a larger portion of the semiconductor body just before the stage illustrated in FIG. 4.

The number of first and second mask windows will depend upon the particular device structure. In this example, where the insulated field effect device is to form a power MOSFET capable of handling relatively large currents, then, as will be explained in greater detail below with reference to FIGS. 11 and 12, the device consists of a great many (typically many hundreds) of parallel-connected insulated field effect device cells 20 (see FIG. 12) sharing a common drain region provided by the first region 4 and having common source and gate electrodes. In such a case, the insulated gate structure 10 is generally formed as a continuous grid or mesh which requires of course the recess 9 to have a similar configuration so to form a continuous grid or mesh-like trench. The trench may have any desired geometry when view in plan. Thus, for example, a rectangular or square mesh or any other regular polygonal shape, such as a hexagonal, mesh may be used. FIG. 5 is a top plan view of a larger area of the semiconductor body 3 just before etching of the recess or trench 9 to show the layout of the first and second masking layers 6 and 8 for one particular selected geometry.

It is of course the second mask window 6b which defines the configuration of the trench 9 and in the example illustrated by FIG. 5, the second mask window 6b is in the form of a continuous regular square mesh aperture defined or bounded by square islands 6c of the first masking layer 6 each containing a first mask window 6a. Each first mask window 6a has a similar geometry and is defined (as shown in phantom lines in FIG. 5) centrally with a respective island 6c.

It will of course be appreciated that, even in the case of a power MOSFET, the insulated gate structure need not form a regular grid or mesh but could have, for example, the form of a number of parallel insulated gate rows connected by the subsequent metallisation or any other suitable arrangement. Generally, the insulated gate structure and the associated regions and thus the first and second mask windows will form a regular or uniform array but this need not necessarily be the case.

After definition of the trench 9 as illustrated in FIG. 4, the first and second masking layers 6 and 8 are removed using conventional techniques which enable selective removal of the first masking layer 6 with respect to the underlying silicon.

The subsequent steps to complete the manufacture of the insulated gate field effect device will be discussed below after the following description of various modifications to the process described above.

Figure 6:
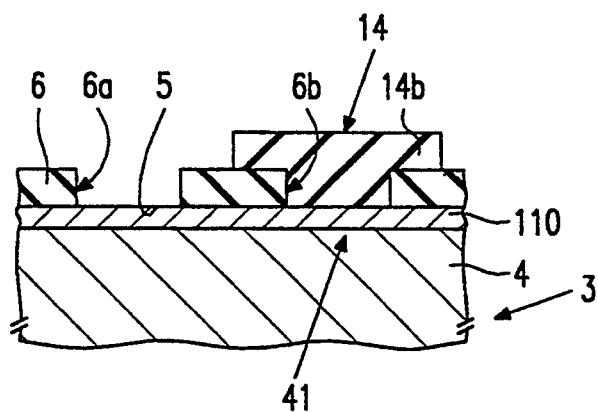
FIG. 6 is a cross-sectional view of a portion of a semiconductor body similar to FIGS. 2 to 4 for illustrating a modified version of a method in accordance with the invention.

In the example described above with reference to FIGS. 1 to 5, the first and second mask windows 6a and 6b are both exposed during the implantation of the p conductivity type impurities thereby forming the regions 70a and 70b beneath the first and second mask windows 6a and 6b. However, as illustrated in FIG. 6, an intermediate mask layer 14 (formed for example of photosensitive resist) may be provided on the first masking layer 6 and patterned using conventional photolithographic and etching techniques to define an auxiliary mask area 14b over the second mask window 6b before the implantation of the p conductivity type impurities. This auxiliary mask area 14b serves to protect the semiconductor area 41 in which the recess 9 is to be formed from the p conductivity type impurities introduced to form, eventually, the second region 7 so that these impurities are not implanted into the area 41. Thus the problem of ensuring that the etching of the recess or trench 9 removes any significant sideways scattered implanted impurities so as to avoid any adverse effect on the device threshold voltage is removed. This means that the selection of the dose and energy of the p conductivity type implant need not be so closely controlled to avoid significant sideways scatter and that the recess or trench etching process need not underetch the second mask window 6b.

As an alternative to using the intermediate mask layer 14 the second mask window 6b could be formed slighly undersize and, after definition of the second masking layer 8, slightly etched so as to increase the lateral dimensions of the second mask window 6b so as to ensure that any significant sideways scattered impurities are removed.

In another alternative, the first and second masking layers 6 and 8 may both be formed of a photosensitive resist material. In this example, the intermediate masking layer 13 is not required and the first masking layer 6 is directly patterned using conventional photolithographic and etching techniques to define the first and second mask windows 6a and 6b as shown in FIG. 3. The patterned resist layer is then hard baked by, typically, heating to about 120° C. (degrees Celsius) at atmospheric pressure in air for about 10 minutes, following which the p conductivity type impurities are implanted with, as in the example described above with reference to FIGS. 1 to 5, the dose and energy of the implant selected to provide second regions 7 of the desired depth and doping concentration and so as to minimise sideways scatter of the impurities which could otherwise adversely affect conduction channel area doping and thus the threshold or voltage of the device if any significant amount of sideways scattered impurities remains adjacent the trench 9 after its formation.

The second photosensitive resist masking layer 8 is then provided over the first masking layer 6 and patterned using conventional photolithographic and etching techniques. The selective patterning of the second photosensitive resist masking layer 8 with respect to the first masking layer 6 without causing any significant deformation or distortion of the first photosensitive resist masking layer 6 and so as to provide a composite mask capable of withstanding the plasma etching process used to define the trench 9 is made possible by the fact that the first photosensitive resist masking layer 6 is hardened by the baking process and by the implantation of the p conductivity type impurities to form the regions 70.

Any conventional anisotropic etching process suitable for use with photosensitive resists may be used to define the recess or trench 9, for example a suitable plasma or RIE etch which may, as discussed above, be designed in known manner to underetch slightly the second mask window 6b so as to remove any sideways scattered impurities.

Again to reduce the affect of any sideways scatter of the impurities beneath the second mask window 6b, the second mask window 6b may be formed slightly undersize and subjected to a slight etch after introduction of the impurities but before definition of the second photosensitive resist layer 8.

In experiments carried out by the inventors, conventional photolithographic and etching techniques were used to define 2 to 3 $\mu$m (micrometer) wide first and second mask windows 6a and 6b in a first photosensitive resist layer 6 provided on the one major surface 5 of a silicon body 3 on top of a thin (typically 50 nm (nanometers)) protective or screen oxide. The semiconductor body 3 was then subjected to a heating or hard baking process in which the semiconductor body 3 was heated to 120° C. for 10 minutes in air at atmospheric pressure. The impurities for forming the second regions 7 were then introduced by implanting boron ions with an energy of 45 keV at a dose of $1 \times 10^{15}$ ions cm$^{-2}$ through the first masking layer 6.

After the implantation, a second layer of photosensitive resist was applied to over the first masking layer 6, exposed and then developed in the normal manner. The exposed areas of the second layer of photosensitive resist were then removed to leave the mask areas 8a of the second masking layer 8. The exposed areas of the second photosensitive resist layer were removed with very high selectivity with respect to the first photosensitive resist masking layer 6 and caused only very slight (less than 0.1 $\mu$m) distortion of the features patterned in the first masking layer 6.

When the composite mask provided by the first and second photosensitive resist masking layer 6 and 8 was used to mask plasma and RIE etching processes, the composite mask was found to be at least as robust as a single hard baked photosensitive resist layer.

It is possible that the mere step of implanting impurities into the semiconductor body 3 through the first masking layer 6 might be sufficient to harden the first masking layer 6 enough to enable subsequent definition of the second masking layer 8 with no significant distortion or deterioration of the first masking layer. However, whether or not the implantation step was sufficient would be dependent upon the nature and characteristics of the implantation step while in the present example, the preceding hard bake serves to ensure that the first masking layer 6 is indeed sufficiently hard, possibly even before the implantation step, to withstand the subsequent definition of the second masking layer 8. Forming both the first and second photosensitive masking layers 6 and 8 of a photosensitive resist results in a process which is relatively cheap and relatively quick compared to previously described examples in which the first masking layer 6 is formed as a deposited insulating layer because of the speed and ease with which photosensitive resists can be applied and patterned.

The use of an insulating layer or hard mask as the first masking layer 6 may have advantages in that such an insulating first masking layer 6 should be less susceptible to attack or erosion by the recess 9 etching process and should moreover facilitate the use of the intermediate masking layer 14 discussed above with reference to FIG. 6 to protect the second mask window 6b from the impurities being implanted to form the second region 7. In contrast it would be extremely difficult where the first and second masking layers 6 and 8 are both formed of photosensitive resist to allow the use of such an intermediate masking layer 14. Thus, it would be necessary to find a material for the intermediate masking layer 14 which enables that layer to be patterned without deforming the baked first masking layer 6 and moreover which can be removed from the first masking layer 6 after the implantation of the impurities for forming the second region 7 without damaging the first masking layer 6 which still must be capable of remaining intact and undistorted during the definition of the second masking layer 8.

The remainder of the process shown in FIGS. 6 to 11 will now be described.

Figure 7:
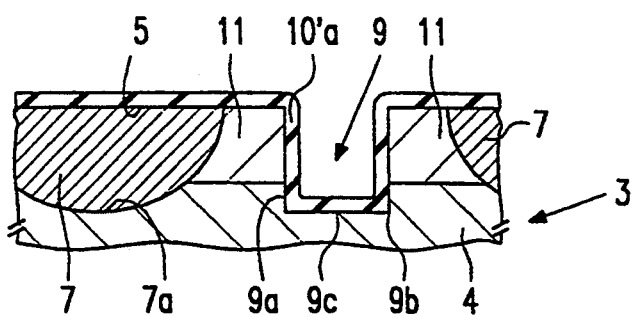
FIGS. 7 to 11 are cross-sectional views for illustrating further steps in a method in accordance with the invention.

After removal of the first and second masking layers 6 and 8, the implanted impurities are caused to diffuse into the semiconductor body 3 to form the second and third regions 7 and 11 as shown in FIG. 7. This is carried out initially in an oxidising atmosphere which defines on the exposed semiconductor surface a thin oxide layer 10'a, so as to inhibit out-diffusion of the boron introduced into the silicon semiconductor body 3 and then in an inert for example nitrogen or argon atmosphere for a time selected to form the second and third regions 7 and 11 to the required depth. The second regions 7 are in this example formed so that their deepest points extend below the bottom 9c of the trench 9. This should ensure that the point at which avalanching would occur during operation of the device is moved away from the trench corners 9b into the bulk of the semiconductor body 3 adjacent the curved pn junctions 7a between the second and first regions 7 and 4. This should at least reduce the possibility of hot charge carrier injection into the gate insulating layer 10a which could otherwise result in performance degradation. Also, moving the point of initiation of avalanching into the bulk of the semiconductor device should be of advantage where the device is to be used for switching an inductive load because higher currents can be carried within the bulk of the semiconductor body thus enabling faster dissipation of the excessive energy resulting from rapid rise in voltage across the device which may occur during the switching of an inductive load than is possible where avalanching is initiated adjacent a recessed insulated gate structure. This should reduce the possibility of irreversible breakdown of the device.

The third regions 11 extend along the majority of the wall 9a of the trench 9 but stop short of the bottom 9c of the trench 9 so that the trench 9 extends slightly into the first region 4.

Forming the second regions 7 so as to be deeper, at their deepest part below the one major surface 5, than the recess or trench 9 should enable the second regions 7 to provide some field relieving action within the device. However, the second regions 7 could be designed so as to be shallower than (for example of similar depth to the third regions 11) or of comparable depth to the trench 9 while still achieving the aim of moving the point of avalanching away from the trench corners 9a because, inter alia, of the fact that the inventors have found that the effect of interface states at the trench-gate insulating layer interface makes it easier to move the avalanching point away from the trench corner 9a than might first have been thought.

Figure 8:
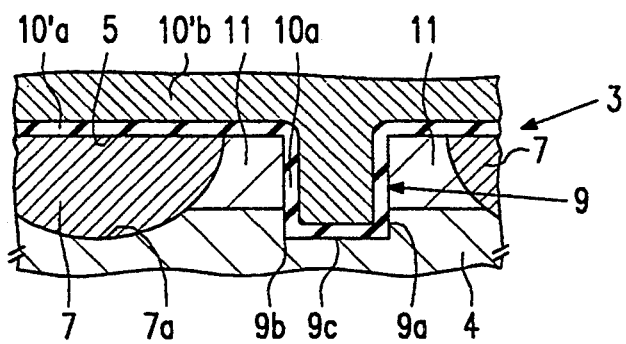

The oxide layer 10′a may be retained in place after the formation of the second and third regions 7 and 11 or may be removed and replaced by a fresh insulating layer, generally again a thermal oxide layer, to form the gate insulating layer 10a as shown in FIG. 8.

A layer 10′b of gate conductive material generally n conductivity type phosphorous-doped polycrystalline silicon, is then deposited over the surface 5 and in the trench 9 as illustrated in FIG. 8. This layer 10′b is then etched back using conventional techniques and using the gate insulating layer 10a as an etch stop to leave the gate conductive regions 10b within and almost completely filling the trench 9 as shown in FIG. 9.

Figure 9:
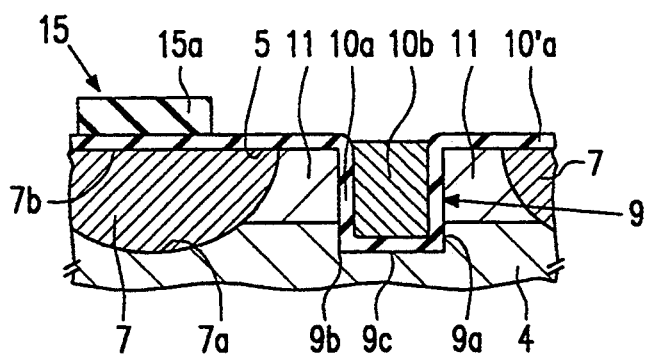
Figure 10:
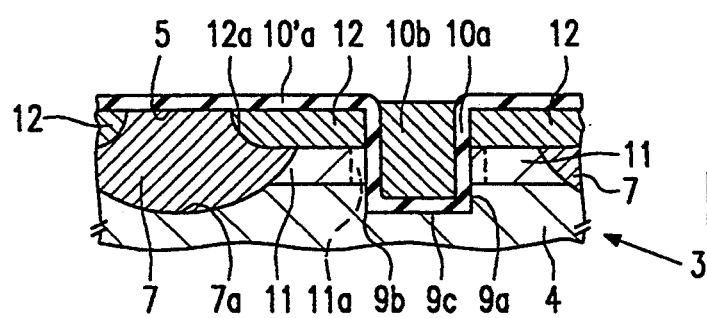

In this example, as illustrated in FIG. 9, a further masking layer 15 is then defined to provide a respective masking area 15a over a central portion 7b of each second region 7. Impurities of the one conductivity type, generally arsenic ions with an energy in the range of, typically, from 120 keV to 150 keV and a dose of, typically, $5 \times 10^{15}$ ions cm$^{-2}$ are then introduced and caused to diffuse into the semiconductor body 3 to define a frame-like fourth or source region 12 for each device cell 20. As an alternative or in addition to arsenic ions, phosphorus ions could be implanted to form the fourth regions 12. As can be seen from FIGS. 10 and 13, the outer periphery of each source region 12 is defined by the trench 9 while the inner periphery is defined by the mask region 15a as a pn junction 12a with the associated second region 7.

Formation of the source regions 12 defines boundaries of the conduction channel areas 11a of the third regions 11. The conduction channel areas 11a adjoin the trench 9 and extend between the source regions 12 and the first region 4, which forms the drain drift region, so as to provide a gateable conductive path between the source and first regions 12 and 4.

Figure 11:
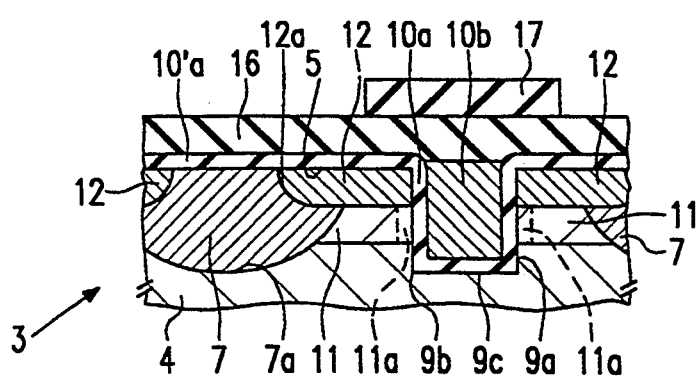
Figure 12:
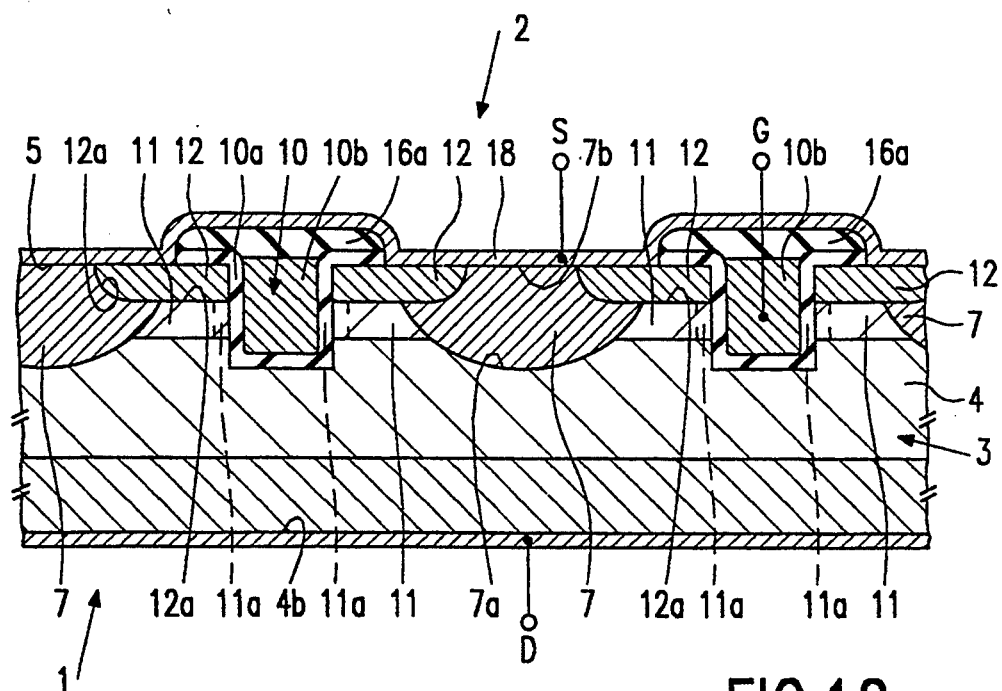
FIG. 12 is a cross-sectional view .of part of a semiconductor device comprising an insulated gate field effect device manufactured using a method in accordance with the invention.

An insulating layer 16, generally silicon oxide, is then deposited over the insulating layer 10′a at the one major surface 5 and another masking layer defined to provide a masking pattern 17 covering the trench 9 and overlapping onto the source regions 12 as shown in FIG. 11. The exposed regions of the insulating layers 16 and 10′a are then etched away to leave a protective insulating region 16a over the insulated gate structure 10 as illustrated in FIG. 12. Although not shown in FIG. 11 or FIG. 12, the masking pattern 17 will also enable a contact window to be formed through the insulating layer 16 to enable electrical contact to the insulated gate structure 10.

Metallisation 18, for example aluminium, is then deposited and patterned to define a source electrode S and an insulated gate electrode G (shown only schematically in FIG. 12). Metallisation 19 is similarly provided on the other major surface 4b of the semiconductor body 3 to define the drain electrode D to which the relatively highly doped substrate 4a makes ohmic connection.

Figure 13:
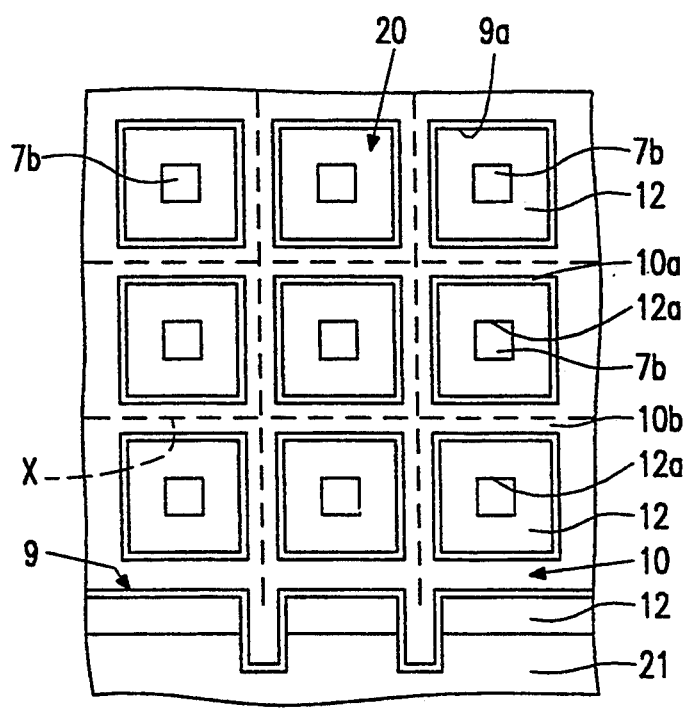
FIG. 13 is a top plan view, with top metallisation omitted, of a part of the semiconductor device illustrated by FIG. 12.

FIG. 13 illustrates by way of a top plan view with the metallisation 18 and protective insulating regions 16a removed, a part of the semiconductor device in accordance with the invention to illustrate the layout of the device cells 20 which are shown notionally divided by dashed lines X.

Although the edge termination structure of the device is not illustrated in FIGS. 1 to 12 nor described above, it will be appreciated by those skilled in the art that the periphery of the insulated gate field effect device will, especially where the device is a power device, have a field relief edge termination system. The edge termination system may be similar to that described in U.S. Pat. No. 5,072,266 and may, for example, comprise a relatively deep p conductivity type guard ring 21 which envelopes the outermost corners of the grid-like trench 9 containing the insulated gate structure 10 as illustrated schematically in FIG. 13. In contrast to the arrangement described in U.S. Pat. No. 5,072,266, the guard ring 21 is formed separately from the second regions 7 and in fact prior to the active device structure. Accordingly, the guard ring 21 may, if desired, have a different dopant concentration from that of the second regions 7 and may for example have a dopant concentration closer to that of the conduction channel defining regions 11. The guard ring 21 may have a field relief electrode extending from the guard ring 21 out onto field oxide (not shown) surrounding the insulated gate field effect device. For higher breakdown voltage devices, say 800 or 1000 or more volt devices, the edge termination system may include one or more field relief semiconductor rings as described in, for example, U.S. Pat. No. 4,573,066 (PHB32934), U.S. Pat. No. 4,774,560 (PHB32950) or U.S. Pat. No. 4,707,719 (PHB33126).

Although in the examples described above, the fourth regions 12 are semiconductor regions, they could be in the form of electrode regions 12 forming Schottky contacts to the third regions 11 in a manner similar to that described in U.S. Pat. No. 4,983,535. Also although the third regions 11 are described above as being formed from a p conductivity type layer formed prior to definition of the first masking layer 6, they could be formed at a later stage in the process, for example with the fourth regions 12, as planar regions. In addition although the recessed insulated gate structure 10 described above has the form of a filled trench, the present invention may be applied to so-called V or U groove technologies in which the gate conductive material does not fill the recess. However a filled trench type of technology should provide for better coverage by subsequent layers because the surface topography should be more flat.

Although the above described methods define the source regions 12 as planar regions, the source regions 12 could be defined by the blanket introduction of n conductivity type impurities by omitting the masking layer 15 and a moat later etched through the centre of each cell 20 to expose an area of the second region 7 before defining the source metallisation. The use of such a moat etching process to short the source regions to the surrounding body region is well known in the power MOS field (see for example Siemens Forschungs und Entwicklungs Berichte Bd 9 (1980) Nr 4 at pages 190 to 194, EP-A-111181 or EP-A-150365).

It will of course be appreciated that the conductivity types given above may be reversed and that the device may be formed using materials or combinations of materials other than silicon.

Although in the examples described above it is the insulated gate structure which forms a regular mesh or grid the present invention could be applied to the inverse structure that is where the first mask windows, and thus the second regions, form a grid-like structure with each second mask window (and thus the insulated gate) being defined within a mask area island bounding the grid-like first mask window. In such a case, the metallisation would be patterned so as to connect the insulated gates to form a common insulated gate structure.

Although the device described above is a vertical IGFET that is with the main current path between the major surfaces of the semiconductor body, the present invention could be applied to lateral devices. The present invention may also be applied to insulated gate bipolar transistors (IGBTs) by, for example, forming the substrate 4a of opposite conductivity type to the subsequent epitaxial layer forming the first region 4 or by forming opposite conductivity discrete injector regions within the substrate 4a which discrete regions are shorted to the substrate by the metallisation and to other MOS-gated devices.

The insulated gate field effect device described above may be a discrete device or could be integrated with other active device elements, for example logic devices where the insulated gate field effect device is a power device to produce a so-called intelligent power switch or smart discrete device.

Although the invention has primarily been described above with reference to power semiconductor devices, it could also be applied to small signal devices consisting of only one or a few insulated gate field effect device cells.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device comprising an insulated gate field effect device, which method comprises providing a semiconductor body having a first region of one conductivity type adjacent one major surface, forming on the one major surface a first masking layer comprising at least one first mask window spaced from a second mask window, introducing into the semiconductor body through the first masking layer impurities for forming regions of the opposite conductivity type to the first region, providing on the first masking layer a second masking layer which is selectively removable with respect to the first masking layer, patterning the second masking layer to leave a mask area covering the first mask window, etching the semiconductor body through the second mask window to form a recess extending into the first region beneath the second mask window while leaving the introduced impurities in the semiconductor body beneath the masked first mask window to form a relatively highly doped second region of the opposite conductivity type, removing the first and second masking layers, providing an insulated gate structure by forming a gate insulating layer in the recess and providing a gate conductive region on the insulating layer, providing a relatively lowly doped third region of the opposite conductivity type extending between the relatively highly doped second region and the insulated gate structure to provide a conduction channel area adjacent the insulated gate structure, and providing a fourth region forming a potential barrier with the relatively lowly doped third region so that the conduction channel area provides a conductive path controllable by the insulated gate structure between the fourth and first regions.

2. A method according to claim 1, which comprises forming the first masking layer to have a plurality of first mask windows with adjacent first mask windows separated by and spaced from the second mask window, introducing the impurities through the first masking layer for forming a respective second region beneath each first mask window and providing a respective third region and a respective fourth region for each second region.

3. A method according to claim 2, which comprises providing the first masking layer so that the second mask window defines a grid-like aperture bounded by islands of the first masking layer within which the first mask windows are formed.

4. A method according to claim 1, which comprises providing an intermediate mask area over the second mask window during the introduction of the impurities for forming the second region.

5. A method according to claim 1, which comprises causing the opposite conductivity type impurities introduced through the first masking layer to diffuse into the first region sufficiently far that the relatively highly doped second region extends into the semiconductor body for a distance from the one major surface greater than a depth of the recess.

6. A method according to claim 1, which comprises forming the fourth region as a semiconductor region of the one conductivity type forming with the relatively high doped second region a pn junction meeting the one major surface.

7. A method according to claim 1, which comprises removing the first and second masking layers before forming the gate insulating layer.

8. A method according to claim 1, which comprises providing the first and second masking layers as layers of photosensitive resist and making the first masking layer resistant to the patterning of the second masking layer by heating the first masking layer and subsequently implanting the opposite conductivity type impurities for forming the second region into the semiconductor body through the first masking layer.

9. A method according to claim 1, which comprises forming the first masking layer by providing an insulating layer on the one major surface, forming a photosensitive resist masking layer having resist mask windows and etching the insulating layer through the resist mask windows to form the first and second mask windows within the insulating layer.

10. A method according to claim 9, which comprises providing the second masking layer as a layer of photosensitive resist.

11. A method according to claim 1, which comprises providing the gate conductive region to fill the recess.

12. A method according to claim 1, which comprises providing the relatively lowly doped third region by forming a continuous layer of the opposite conductivity type adjacent the one major surface prior to defining the first masking layer.

* * * * *